United States Patent [19]

Cuomo et al.

[11] Patent Number: 4,538,067
[45] Date of Patent: Aug. 27, 1985

[54] SINGLE GRID FOCUSSED ION BEAM SOURCE

[75] Inventors: Jerome J. Cuomo, Lake Lincolndale; James M. E. Harper, Yorktown Heights; Gary A. Waters, Peekskill, all of N.Y.

[73] Assignee: International Business Machines Corporation, Armonk, N.Y.

[21] Appl. No.: 448,122

[22] Filed: Dec. 9, 1982

[51] Int. Cl.³ .............................................. H01J 3/14
[52] U.S. Cl. ................................ 250/396 R; 250/427; 313/361.1
[58] Field of Search .................. 250/396 R, 398, 423, 250/427; 313/359.1, 360.1, 361.1, 362.1, 363.1; 315/111.81

[56] References Cited

U.S. PATENT DOCUMENTS

| | | | |
|---|---|---|---|
| 2,785,311 | 3/1957 | Lawrence | 250/426 |
| 4,028,579 | 6/1977 | King | 313/361.1 |
| 4,119,881 | 10/1978 | Calderon | 250/423 R |
| 4,259,145 | 3/1981 | Harper et al. | 313/359.1 |
| 4,381,453 | 4/1983 | Cuomo et al. | 250/398 |
| 4,439,684 | 3/1984 | Hemmerich et al. | 313/361.1 |

Primary Examiner—Bruce C. Anderson
Attorney, Agent, or Firm—Jackson E. Stanland

[57] ABSTRACT

A technique for providing an ion beam of variable focussing (concentration) is described using a flexible grid for extracting and accelerating ions from an ion plasma. The grid is electrically conducting and will bow depending on a voltage difference between it and the ion plasma. This bowing of the grid from its initial planar configuration provides focussing of the ion beam. The amount of focussing depends upon the amount the grid is bowed, which in turn depends upon the voltage difference between it and the ion plasma. The same ion source/flexible grid combination can be used for different operations as for example, providing a collimated, low energy ion beam over a large area and then for providing a focussed ion beam of high energy onto a small area.

23 Claims, 5 Drawing Figures

SINGLE GRID FOCUSSED ION BEAM SOURCE

DESCRIPTION

1. Technical Field

This invention relates to ion beam sources, and more particularly to the use of a single, flexible grid which can be electrostatically bowed to provide focussing of the ion beam.

2. Background Art

Ion beam sources are used for many applications, including both deposition and etching of semiconducting and insulating materials. Some examples of these etching processes include ion milling, plasma etching, and reactive ion etching. Each of these types of etching has different advantages, as is known in the art. Depending upon the types of etching required, the ions can be either reactive or nonreactive with the materials they strike.

In ion beam deposition, the ion beam strikes a target in order to release atoms therefrom, which travel to substrates where they nucleate. This type of operation often requires a focussed ion beam of sufficient energy in order to release target atoms.

Whether the ion beams are used for etching or for deposition, the ion beam source typically includes one or more grids to provide the ion beam. The use of these grids allows the production of ion beams of different energies, and different focussing, so that the ion beam can be tailored to the desired application. For example, U.S. Pat. No. 3,042,133 describes a cold cathode glow discharge device for providing a focussed ion beam, in which a curved mesh 13 is employed. Mesh 13 has a fixed shape, and this apparatus operates only with discharge voltages of 5-15 kV. At these high voltages, very high sputtering rates will occur from mesh 13. Also, the apparatus of that reference requires high gas pressures, which will cause increased gas scattering of atoms, leading to contamination.

Other references generally showing non-planar grids include U.S. Pat. No. 4,119,881; U.S. Pat. No. 2,975,277 and U.S. Pat. No. 2,570,124. Additionally, spherical graphite grids are known for application in ion beam sources. These graphite grids are generally used in pairs, one of the grids being a screen grid for extracting ions from a plasma, and the other being an accelerator grid for accelerating the extracted ions to a target or substrate.

When a pair of grids is used, a shielding effect occurs which reduces the maximum ion current that can be extracted. This maximum ion current is inversely proportional to the square of the distance between the grids. In order to overcome this problem, the invention of U.S. Pat. No. 4,259,145 provides a single extraction grid having multiple apertures in order to obtain high current densities at low ion energies. In that reference, the plasma sheath (between the plasma and the single grid 22) is used as a screen grid in order to extract a collimated beam of ions. Several advantages are described in that reference, including ease of manufacturing and low cost, the use of low energy ions in the beam to minimize physical sputtering, and the availability of a high current density of ions in the beam.

The present invention seeks to overcome the high cost of machined spherical graphite grids of the type used to provide a focussed ion beam, while at the same time providing high voltage, high current ion beams. Additionally, the present invention provides in a single apparatus a grid assembly which can be used both to produce a broad, uniform ion beam of low energy and a concentrated ion beam of high energy, without having to remove and replace one grid system with another.

Thus, it is an object of the present invention to provide an ion beam system which can provide a plurality of different types of ion beams, without the requirement for replacing one grid system with another.

It is another object of the present invention to provide an ion beam system using a single grid for the provision of a uniform, collimated ion beam, and for the provision of a focussed, high energy ion beam.

It is another object of the present invention to provide an ion beam apparatus that can be used for cleaning substrates, etching, and deposition of atoms onto substrates.

It is another object of the present invention to provide an ion beam system having focussing capabilities, dependent only upon applied voltages.

It is still another object of the present invention to provide ion beams of high current densities at low energies.

It is another object of the present invention to provide an ion beam source using a grid assembly in which sputtering of materials from the grid is minimized.

It is another object of the present invention to provide an ion beam source using a grid assembly for extraction and acceleration of ion beams, where the source uses low gas pressures to minimize scattering of atoms, and therefore minimizes contamination.

It is another object of the present invention to provide an ion beam apparatus in which ion beams of different current densities can be provided by using a single grid system.

It is another object of this invention to provide an ion beam apparatus and method where variable grid focussing lengths can be obtained as a function of applied voltages.

It is another object of this invention to provide a technique for providing focussed ion beams of differing concentration by varying applied voltages, using a single grid system.

It is a further object of this invention to provide an ion beam apparatus using a low cost, flexible grid having focussing capability and self alignment.

It is another object of this invention to provide a process for producing an ion beam from an ion plasma, where the degree of focussing of the ion beam depends upon the voltage difference between an ion plasma and a flexible, conductive grid.

DISCLOSURE OF THE INVENTION

This invention is an apparatus and method for producing an ion beam, using a flexible, multiapertured grid whose shape (curvature) is dependent upon the voltage difference between it and an adjacent ion plasma. At low voltage differences, the grid has an essentially planar configuration (i.e., zero curvature) and can be used to provide a uniform collimated ion beam such as that described in aforementioned U.S. Pat. No. 4,259,145. At a larger voltage difference, the grid will begin to bow due to electrostatic attraction toward the positive ion discharge plasma. It will then assume a more spherical shape and will focus the ions extracted from the plasma. Depending upon the magnitude of the voltage difference, different amounts of bowing (curvature) will be obtained in order to provide different degrees of focussing of the ion beam.

This ion beam source and method operates with only a single grid. The exact technique by which ions are created in the discharge plasma is not important to the invention, nor is the coarseness of the multi-apertured grid. It is only necessary that tt.e grid be comprised of an electrically conductive material and have sufficient flexibility that it can be bowed by a voltage difference between it and the plasma. Of course, it is desirable to have a grid with a high percentage of open area so that large ion beam currents will be obtained. It is also desirable to have a grid using fine wire in order that the grid be very flexible. This will provide a greater range of grid deflections for a given range of applied voltages.

In a particular example, this ion beam apparatus can be used to provide both cleaning of substrates and ion beam deposition onto the substrates without the need to change grids or remove the substrates to a different ion beam source. A sufficiently low voltage is applied between the grid and the plasma so that the grid maintains its initial planar shape. In this mode, it is used to provide a low energy, uniform ion beam for cleaning the substrates. After this, the substrates are moved away from the path of the ion beam and a target is located in the path of the ion beam. By increasing the voltage difference between the plasma and the grid, the grid will bow to produce focussing of the ion beam. This high energy, focussed beam will impinge upon a target and release atoms therefrom, which will then travel by line-of-sight to the clean substrates where they will deposit thereon. This 2-step process can be accomplished within a single vacuum chamber and with the same ion beam source-grid system.

These and other objects, features, and advantages will be apparent from the more particular description of the preferred embodiments.

BRIEF DESCRIPTION OF THE DRAWINGS

In FIG. 4, a uniform ion beam is used to, for instance, clean substrates while in FIG. 5 a focussed ion beam is used to release atoms from a target which then deposit on the cleaned substrates. A single substrate-target holder is illustrated which can be rotated and translated in the vacuum chamber to expose either the substrates or the target to the ion beams.

BEST MODE FOR CARRYING OUT THE INVENTION

Figure 1:
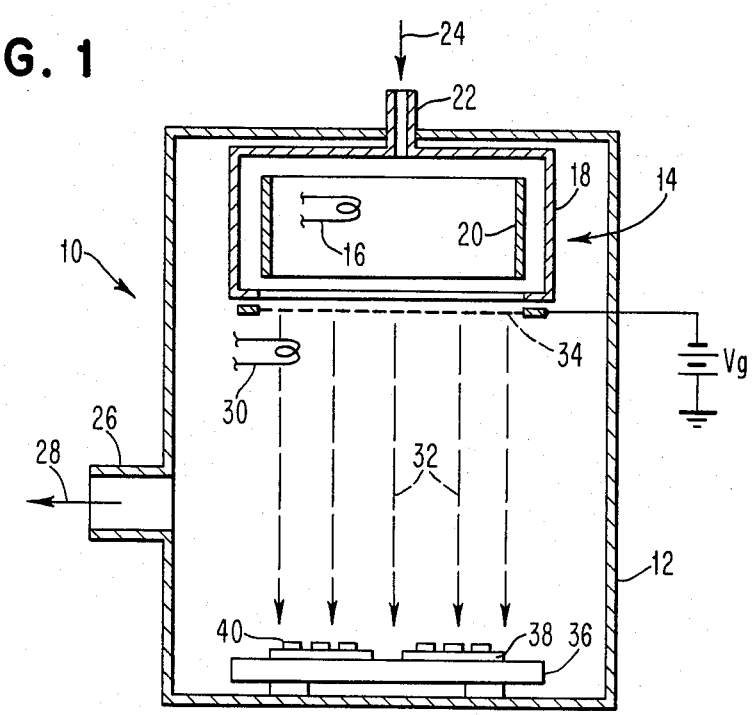
FIG. 1 is a schematic illustration of this invention where a single, flexible multi-apertured grid is used to produce a uniform ion beam.

FIG. 1 shows an ion beam system 10 for producing an ion beam within chamber 12, which is, for instance, a conventional vacuum chamber. An ion source 14 is located within chamber 12, and includes a thermionic cathode 16 located within the walls 18 of the ion source 14. A cylindrical anode 20 is also located within walls 18. While the anode 20 is generally shown as a cylindrical anode in this drawing, it can be the type of anode shown in U.S. Pat. No. 4,259,145. Inlet port 22 is used to provide a gas into the ion source, as indicated by the arrow 24. As will become more apparent, the input gas is ionized within chamber walls 18 to provide an ion plasma.

Chamber 12 is provided with an outlet port 26, which can be used to remove volatile gasses, etc., from within chamber 12, as indicated by the arrow 28. Also located within chamber 12 is a neutralizer cathode 30, which is used to provide electrons to counteract the positive ions in the ion beam, represented by arrows 32. Such neutralizing electrons are particularly useful if the substrates subjected to the ion beams are insulating wafers. This type of neutralizing operation and the general structure of the total ion beam system 10 are well known in the art.

A single, flexible grid 34 is used to extract ions from the ion plasma formed within chamber walls 18, and for accelerating the ions. Grid 34 is typically provided with a negative potential with respect to ground as illustrated by the source $V_g$.

A holder 36 is located within chamber walls 12, and is used to hold the substrates 38. As shown in FIG. 1, a masking layer 40 is provided on the substrates 38, and serves to delineate the areas of the substrates to be struck by the ion beam 32.

In operation, heating current is applied to the thermionic cathode 16 to create free electrons. A discharge voltage between cathode 16 and anode 20 is applied at about 50-100 volts. A gas, such as argon, $CF_4$, etc. is applied through inlet port 22. Electrons emitted from cathode 16 are accelerated to anode 20 by the discharge voltage, and strike the gas atoms within chamber walls 18. This creates an ion plasma within walls 18. These positive ions are accelerated from the discharge chamber 18 by a high voltage (typically 500-1000 V) applied between the anode 20 and ground. The ions are extracted by the grid 34 and exit chamber 18 as a collimated beam 32.

It should be understood that the particular structure of the ion source 14 and the biases applied to the various components thereof can be changed from that shown in FIG. 1, in order to be able to provide the plasma of ions and electrons in chamber 18.

In this invention, only a single grid 34 is required. This is a multi-aperture grid comprised of a conducting material, which is sufficiently flexible to be bent by an electrostatic pressure as will be explained with respect to FIG. 2. Suitable materials for grid 34 are conducting materials which exhibit low sputtering yields. A choice of such materials will mean that the grid is not severely sputtered by the ions extracted from the plasma, which will enhance grid life and reduce contamination in chamber 12. Some examples for the material comprising grid 34 include Si, Mo, carbon fiber meshes, Ni, W, Ta, Nb, etc. Generally, conducting refractory materials having high melting points are desirable, since they will be able to withstand high temperatures and the high energies of the ion beam.

The number and size of the apertures in the grid are not critical, as long as the grid can be bowed by electrostatic pressure. Thus, the fineness of the grid (measured by the closeness of the wire lines in the grid) and the amount of open area (the percentage of open area in the grid in a given square area) are also not critical. Examples will be given for suitable grids later in the specification.

Figure 2:
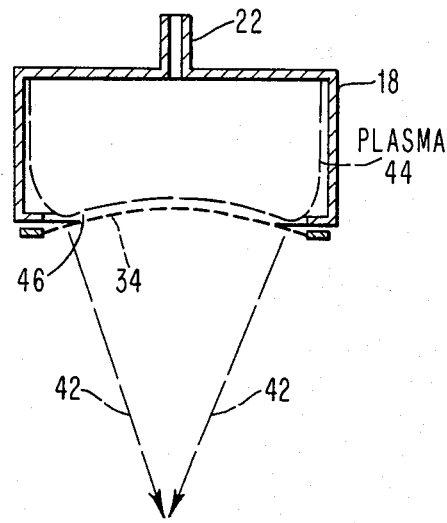
FIG. 2 is a schematic illustration of a portion of the apparatus of FIG. 1, illustrating bowing of the multi-apertured grid to produce focussing of the ion beam.

In FIG. 1, grid 34 is substantially planar and is used to provide a collimated uniform ion beam as illustrated by the ion trajectory lines 32. In FIG. 2, however, the grid 34 is bowed and is used to provide a focussed ion beam, as illustrated by the ion trajectory lines 42. As is known, the plasma 44 of ions and electrons has a positive potential with respect to grid 34. A voltage difference V will be produced between the plasma 44 and the grid 34. Plasma 44 will be separated from grid 34 by a small distance d termed the plasma sheath 46. The force which bows grid 34 will cause it to be attracted upwardly toward the plasma 44, and is directly proportional to the square of the voltage V and inversely proportional to the square of the sheath thickness d. This can be expressed mathematically as a pressure acting on grid 34, in the following manner:

Grid 34 and the lower edge of plasma 44 form a capacitor of capacitance $$C = \frac{\epsilon_o A}{d}$$

where
$\epsilon_o$ = permittivity of space
A = area
d = sheath thickness.

The grid feels a force $$F = 1/2\epsilon_o \frac{AV^2}{d^2},$$

or a pressure $$P = 1/2\epsilon_o \frac{V^2}{d^2}.$$

In a representative example, d is approximately 0.1 mm and V = 1000 volts. For $\epsilon_o = 8.9 \times 10^{12}$ (the permittivity of free space), P = 500 N/m² = 500 Pa, or approximately 3 torr.

Therefore, the curvature of grid 34 can be controlled by choosing a flexible grid which bows under a pressure of several torr. This allows the focal length of the grid to be adjusted, in accordance with the voltage V.

As an example, a flexible grid comprised of a Ni mesh of wires having 100 wires/inch and a total diameter of 7 cms was deflected to have a maximum height above its planar configuration of 1 cm when the voltage V was 1000 volts. This Ni mesh had an open area of about 82% of its total area.

Figure 3:
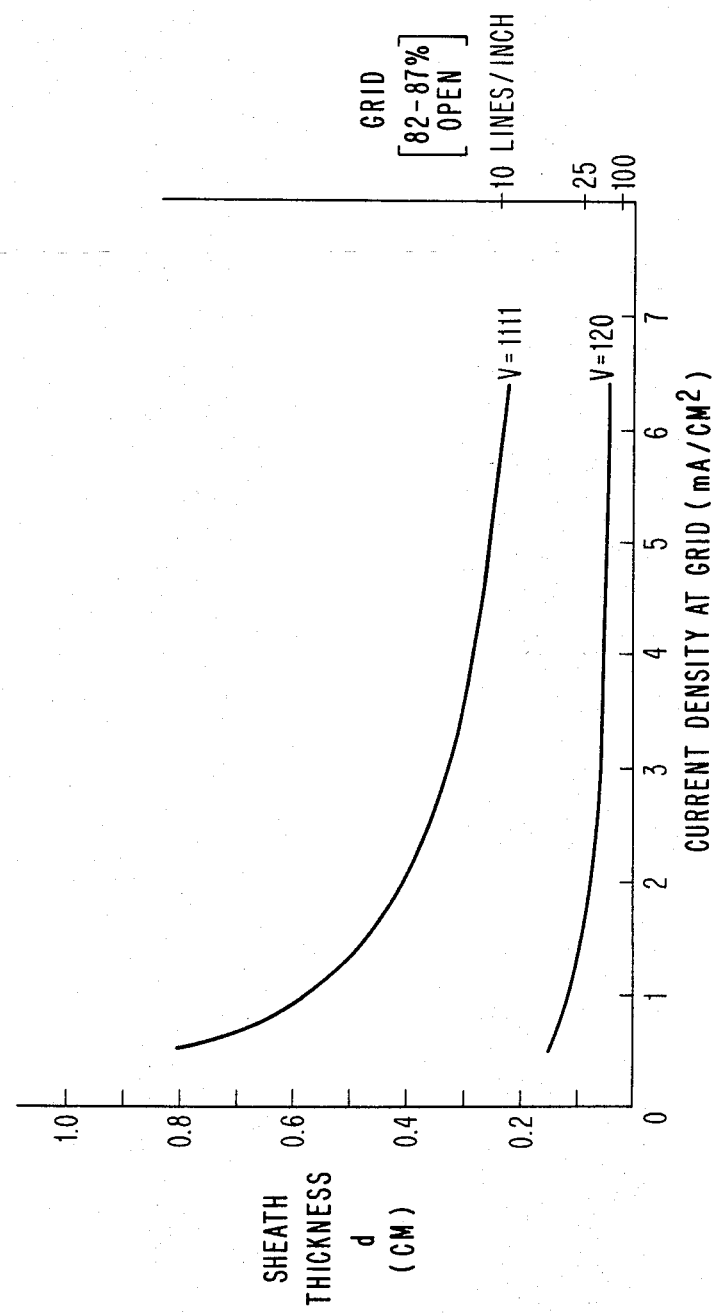
FIG. 3 is a plot of sheath thickness versus current density at the grid, for two voltage differences. The current through the grid and the aperture size of the mesh in the grid is also illustrated in this plot.

FIG. 3 is a plot of the plasma sheath thickness (d) versus current density (mA/cm²) at the grid, with an argon ion discharge plasma. Curves are shown for voltage differences V of 120 volts and 1111 volts. In this example, Ni mesh grids were used having open areas of approximately 82–87% of the total area of the grid. The number of lines/inch of the grid is indicated on the right hand ordinant. The current density j at the grid is given by $$j(\text{ma/cm}^2) = (8.64 \times 10^6) \frac{V^{3/2}}{d^2}.$$

In order to provide a collimated ion beam when the grid has a planar configuration, there is a relationship between the aperture size in the grid and the sheath thickness d. This is explained in U.S. Pat. No. 4,259,145 and, in the situation depicted in FIG. 3, the sheath thickness d must be equal to or greater than twice the aperture size of the mesh grid for collimation.

As an example, to generate a collimated ion beam at V = 120 V, (approximately equal to the ion energy), a mesh size of 100 lines/inch is fine enough for ion current density values up to 7 mA/cm², and is also suitable for a voltage of 1111 V.

On the other hand, a mesh size of 25 lines/inch, although suitable at V = 1111 V, is too coarse at V = 120 V, and would cause a divergent beam profile at this energy.

In the practice of the present invention, various mesh sizes can be used, as long as the grid is sufficiently flexible to be bowed by electrostatic pressure. Further, it is desirable, but not necessary, that the grid be bowed at reasonable voltage differences, so that a plurality of different focal lengths can be easily obtained without adverse effects to other components in the ion beam apparatus.

Figure 4:
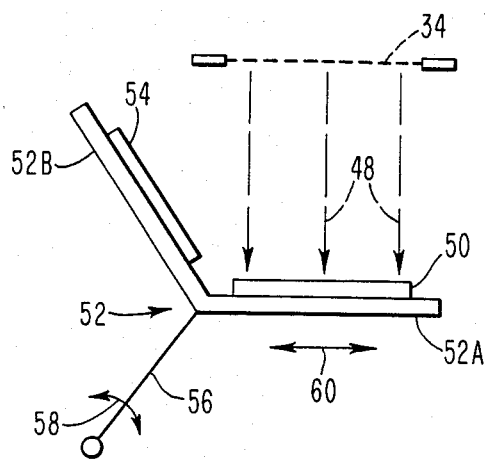
FIGS. 4 and 5 illustrate a technique wherein the grid of this invention can be used to provide uniform ion beams over a large area and focussed ion beams over a small area.
Figure 5:
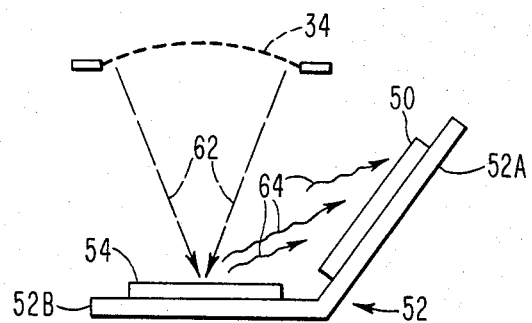

FIGS. 4 and 5 illustrate the use of this ion beam system for different operations without the requirement for multiple sets of grids. In FIG. 4, the grid 34 is used to extract and accelerate a uniform, low energy ion beam indicated by the ion beam trajectory lines 48. This is a low energy, collimated beam which can be used to clean substrates 50 located on a holder 52. Holder 52 is a V-shaped holder comprised of a first portion 52A and a second portion 52B. A target 54 is located on portion 52B.

Holder 52 is located in the vacuum chamber 12 (FIG. 1) and is capable of being rotated and translated in the vacuum chamber, to bring either substrates 50 or target 54 into the path of the ion beam. To do so, one or more control levers 56 extend through the chamber walls 12 and can be manipulated by an operator to provide rotary motion in accordance with arrow 58, and translation in accordance with arrows 60.

In a first step, the substrates 50 are exposed to the collimated ion beam 48, and are cleaned by a low energy ion beam. In this operation, the anode voltage is reasonably low (about 100 volts) and the grid 34 is planar. This means that the voltage difference between the plasma sheath and the grid is sufficiently small that the grid will not bow.

In FIG. 5, the voltage on the anode is increased and the voltage difference between the plasma and the grid 34 is sufficient to bow the grid. This provides focussing of the ions, as indicated by the ion trajectory lines 62. In this operation, the holder 52 has been rotated and translated in order to bring the target 54 into the path of the focussed ion beam. The concentrated, high current density ion beam is sufficient to cause sputtering of atoms from target 54, the atoms then travelling to the substrate 50, as indicated by the arrows 64. These atoms deposit onto substrate 50 (which could be masked in order to provide selective deposition thereon).

The operations of substrate cleaning and ion deposition, indicated by FIGS. 4 and 5, occur in the same vacuum chamber, without the need to change grids in order to provide two different ion beams. Further, the amount of focussing is dependent upon the applied voltages and for this reason high voltage, high current ion beams can be provided over different areas. Still further, the bowing of the grid 34 is always in a manner which provides self alignment since the pressure causes substantially perfect bowing of the grid.

In this invention, the effects that are obtained with a plurality of rigid spherical grids are obtained in a single grid system. Therefore, all of the advantages (listed in aforementioned U.S. Pat. No. 4,259,145 of the single grid are obtained in the present invention. However, additional advantages are also achieved due to the focussing effects which can be obtained.

It has been previously mentioned that the number of apertures and the size of an individual aperture can be selected in accordance with the flexibility desired. That is, one who is designing the ion beam source would choose a grid in such a way that the desired focussing would be obtained within a given voltage range. One example has been given previously, but other grids can be easily formed using commercially available materials.

Various companies provide many different types of electroformed wire mesh, where the wire is available in different metals, such as nickel, copper, silver and gold. These wire meshes are available in many different wire densities (i.e., number of wires per inch) and percentages of open area. These wire meshes are also available with different size apertures. Successful operation in an ion beam source of the type described has been obtained using a nickel wire mesh having 100 lines/inch, and square apertures 0.00895 inch wide. The mesh is available up to sizes 6 inch×6 inch and has an open area of 82%.

Another suitable grid is one in which each aperture is square shaped, having a size of one millimeter on an edge. Wire diameters of 0.002 inch were used, where the spacing between wires was 0.042 inch, leading to 24 lines (wires/inch).

What has been described is an ion beam system and method wherein electrostatic attraction is used to bow a flexible grid in order to provide focussing of an ion beam. The particular manner in which the ion plasma is developed is incidental, the principle of the invention being the use of a flexible grid for accelerating ions and for focussing these ions in accordance with a voltage differential. Accordingly, the grid is made of a material having multi-apertures, in such a manner that it will be flexible when a sufficient voltage difference appears between it and the ion plasma.

The technique of this invention can be applied to the formation of bowed grids. For example, the bowed grid may be the desired end product, and often has to be substantially perfect in its bowing. It may include one or more aligned spherical grids. One instrument requiring such grids is a cylindrical analyzer.

In order to maintain the grid deformation, other steps may be added to the process, such as coating the grid while it is in its electrostatically deformed state or annealing the grid material (for example, Be-Cu softened to a tempered state).

Shape-memory alloys could be used for the grid material, as well as precipitate-hardened alloys which are heat treated while in the deformed state.

While the invention has been described with respect to particular embodiments thereof, it will be understood by those of skill in the art that variations can be envisioned without departing from the spirit and scope of the invention.

Having thus described our invention, what we claim as new and desire to secure by Letters Patent is:

1. An ion beam system for producing a beam of ions, comprising in combination:
   means for producing a plasma of charged ions,
   a flexible multiapertured grid comprised of an electrically conducting material and located close to said plasma for extracting ions from said plasma and for accelerating said extracted ions, said grid being sufficiently flexible that it will bow toward said plasma by electrostatic attraction to said plasma, and
   means for biasing said grid.

2. The system of claim 1, where the voltage difference between said plasma and said grid is sufficiently great that said grid bows into a generally spherical shape.

3. The system of claim 1, where said grid is comprised of a metal.

4. The system of claim 1, where said grid is comprised of a wire mesh.

5. The system of claim 1, including means for changing the amount of bowing of said grid.

6. The system of claim 1, where said grid is substantially planar in a first configuration and is used to extract a collimated ion beam and is bowed into a generally spherical shape in a second configuration and is used to produce a focussed ion beam.

7. The system of claim 1, where said ions are positive ions.

8. The system of claim 7, where said grid is biased negatively with respect to the potential of said plasma.

9. A process for forming a focussed beam of ions, comprising the steps of:
   forming a plasma of charged ions,
   extracting said ions from said plasma using a single flexible extraction grid having multiapertures therein, said extraction grid being located near said plasma and being comprised of an electrically conductive material, wherein said grid is sufficiently flexible to be bowed by electrostatic attraction of said plasma, and
   applying a potential to said grid which is negative with respect to the potential of said plasma, the voltage difference between said plasma and said grid being sufficiently great to cause bowing of said grid into a generally spherical shape, said grid focussing said extracted ions when bowed into said generally spherical shape.

10. The process of claim 9, where said grid becomes less bowed as the voltage difference between said grid and said plasma potential decreases.

11. The process of claim 10, where said grid is substantially planar for voltage differences less than a certain amount depending upon the flexibility of said grid.

12. The process of claim 9, where said grid is substantially planar in a first configuration in order to extract a collimated, low energy ion beam, and is bowed into a generally spherical shape in a second configuration in order to provide a focussed, high energy beam of ions.

13. The method of claim 9, including the further step of changing the amount of electrostatic attraction between said plasma and said grid.

14. The process of claim 9, where said ions are positively charged ions.

15. The process of claim 9, where said grid experiences a force electrostatically exerted on it which is directly proportional to the square of the voltage difference between said grid and said plasma potential, and inversely proportional to the square of the distance between said grid and said plasma.

16. The process of claim 9, including the further step of changing the amount of bowing of said grid by changing the voltage applied to said grid.

17. A process for producing a focussed beam of ions, comprising:
   forming an ion plasma with an electron bombardment ion source including a cathode, and an anode located in a plasma discharge chamber,
   using a single flexible extraction grid having multiple apertures located at the end of said discharge chamber, said extraction grid being used to extract ions from said plasma, and
   applying a voltage potential to said grid which is negative with respect to ground and is different from the plasma potential, the voltage difference between said grid and said plasma potential being sufficient to bend said grid into a substantially curved shape, said extracted ions being focussed by said curved grid.

18. The process of claim 17, where said grid has an essentially planar configuration when the voltage difference between it and said plasma is less than an amount which depends upon the flexibility of said grid.

19. A method for forming a focussed beam of ions, comprising the following steps:
   forming an ion plasma with an electron bombardment ion source including an anode and a cathode located in a plasma discharge chamber,
   using a single flexible extraction grid having a multiple number of apertures therein to extract ions from said discharge chamber, said grid being located at the end of said discharge chamber and having an initial configuration which is substantially planar, and
   increasing the voltage difference between the voltage on said grid and the potential of the plasma to an amount sufficient to cause bowing of said grid to change its planar configuration to a generally curved configuration, said curved configuration causing focussing of the ions extracted from said plasma.

20. The process of claim 19, where said ions are positive.

21. A method for forming a focussed beam of positively charged ions, comprising the steps of:
   forming an ion plasma in a plasma discharge chamber,
   applying an electrical potential to a flexible multiapertured grid located near the end of said discharge chamber to produce a potential difference between said ion plasma and said grid to extract ions from said chamber, and
   increasing the electrostatic attraction between said plasma and said grid by changing said potential difference to bend said grid thereby causing focussing of the ions extracted from said plasma, the amount of bending of said grid being dependent on the amount of electrostatic attraction it experiences.

22. The method of claim 21, where the amount of bending of said grid is reduced when the magnitude of said electrostatic attraction is reduced.

23. The method of claim 22, where said grid assumes a substantially planar configuration when said electrostatic attraction is reduced below an amount dependent upon the flexibility of said grid.

* * * * *